United States Patent
Benjamin Raj et al.

(10) Patent No.: US 12,473,637 B2
(45) Date of Patent: Nov. 18, 2025

(54) INTERLOCK SYSTEM FOR PROCESSING CHAMBER EXHAUST ASSEMBLY

(71) Applicant: Applied Materials, Inc., Santa Clara, CA (US)

(72) Inventors: Daemian Raj Benjamin Raj, Fremont, CA (US); Liliya I. Krivulina, Santa Clara, CA (US); Bharath Kumar Hanchanoor Rathnakara Gowda, Cupertino, CA (US); Collen Leng, San Jose, CA (US); Syed A. Alam, San Jose, CA (US); Uwe P. Haller, San Jose, CA (US); Robert Casanova, San Jose, CA (US); Ryan Thomas Downey, San Jose, CA (US); Peter Standish, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 394 days.

(21) Appl. No.: 17/883,368

(22) Filed: Aug. 8, 2022

(65) Prior Publication Data

US 2024/0043994 A1 Feb. 8, 2024

(51) Int. Cl.
  *C23C 16/44* (2006.01)
  *H01L 21/67* (2006.01)

(52) U.S. Cl.
  CPC .... *C23C 16/4412* (2013.01); *H01L 21/67248* (2013.01); *H01L 21/67253* (2013.01)

(58) Field of Classification Search
  CPC ......... H01L 21/67253; H01L 21/67248; C23C 16/4412
  See application file for complete search history.

(56) References Cited

U.S. PATENT DOCUMENTS

2004/0081757 A1* 4/2004 Ishizaka .............. C23C 16/4405
  427/248.1
2004/0206237 A1 10/2004 Sherer
(Continued)

FOREIGN PATENT DOCUMENTS

CN 109154082 A 1/2019
KR 20110054675 A 5/2011
(Continued)

OTHER PUBLICATIONS

Application No. PCT/US2023/029342, International Search Report and Written Opinion, Mailed on Nov. 9, 2023, 8 pages.
(Continued)

*Primary Examiner* — Joseph A Miller, Jr.
(74) *Attorney, Agent, or Firm* — Kilpatrick Townsend & Stockton LLP

(57) ABSTRACT

Exemplary semiconductor processing systems may include a gas source coupled with a number of processing chambers. The gas source may include a controller. Each chamber may include an exhaust assembly having a foreline and a pump. The systems may include at least one abatement system coupled with each pump. The systems may include a plurality of exhaust lines that extend between each pump and the abatement system. The systems may include a dilution gas source coupled with each exhaust line. The systems may include a mass flow controller coupled between the dilution gas source and each exhaust line. The systems may include a temperature sensor coupled with each exhaust line between the pump and the abatement system. The temperature sensor may be communicatively coupled with the controller of the gas source, which may control flow of a gas to a chamber based on a measurement from the temperature sensor.

9 Claims, 3 Drawing Sheets

(56) References Cited

U.S. PATENT DOCUMENTS

| | | | |
|---|---|---|---|
| 2005/0142010 A1* | 6/2005 | Bailey | F04D 25/00 |
| | | | 417/423.4 |
| 2005/0178332 A1 | 8/2005 | Arno et al. | |
| 2007/0053803 A1* | 3/2007 | Lee | B01D 47/14 |
| | | | 422/168 |
| 2007/0187386 A1* | 8/2007 | Kim | H01L 21/324 |
| | | | 219/385 |
| 2012/0094010 A1* | 4/2012 | Sugiura | C23C 16/52 |
| | | | 427/8 |
| 2013/0164943 A1* | 6/2013 | Koshi | C23C 16/24 |
| | | | 118/712 |
| 2019/0284684 A1 | 9/2019 | Shigaki et al. | |
| 2019/0368037 A1* | 12/2019 | Neuber | C23C 16/54 |
| 2022/0129698 A1 | 4/2022 | Moradian et al. | |

FOREIGN PATENT DOCUMENTS

| | | |
|---|---|---|
| KR | 101099854 B1 | 12/2011 |
| KR | 20130075677 A | 7/2013 |
| TW | 200413111 A | 8/2004 |
| TW | 200901287 A | 1/2009 |
| TW | 202216313 A | 5/2022 |
| WO | 2008078950 A1 | 7/2008 |

OTHER PUBLICATIONS

Application No. KR10-2025-7007094, Office Action, Mailed on Sep. 1, 2025, 15 pages.

* cited by examiner

INTERLOCK SYSTEM FOR PROCESSING CHAMBER EXHAUST ASSEMBLY

FIELD OF THE INVENTION

The present technology relates to components and apparatuses for semiconductor manufacturing. More specifically, the present technology relates to gas delivery and exhaust systems and other semiconductor processing equipment.

BACKGROUND OF THE INVENTION

Integrated circuits are made possible by processes which produce intricately patterned material layers on substrate surfaces. Producing patterned material on a substrate requires controlled methods for forming and removing material. Precursors are often delivered to a processing region and distributed to uniformly deposit or etch material on the substrate. During and after processing operations, these precursors and/or other gases are exhausted out of the processing region for disposal. In the case of toxic and/or flammable gases, the disposal of the gases may involve burning the toxic gases in an abatement system. Such disposal requires the toxic gas to be diluted with other gases prior to abatement, as well as requires the use of abatement gases (such as oxidizing gases) that help fuel the abatement system.

Thus, there is a need for improved systems and methods that can be used to abate toxic and/or flammable gases while reducing the volume of dilution and/or abatement gases consumed. These and other needs are addressed by the present technology.

BRIEF SUMMARY OF THE INVENTION

Exemplary semiconductor processing systems may include at least one gas source fluidly coupled with one or more processing chambers. The at least one gas source may include a controller. Each processing chamber may include an exhaust assembly having a foreline and a pump fluidly coupled with the foreline. The systems may include at least one abatement system fluidly coupled with a downstream end of each pump. The systems may include a plurality of gas exhaust lines. Each gas exhaust line may extend between a respective pump and the abatement system. The systems may include at least one dilution gas source fluidly coupled with each gas exhaust line. The systems may include at least one mass flow controller coupled between the at least one dilution gas source and each gas exhaust line. The systems may include at least one temperature sensor coupled with each gas exhaust line at a position between the respective pump and the abatement system. The at least one temperature sensor may be communicatively coupled with the controller of the at least one gas source. The controller may control a flow of a gas to at least one of the one or more processing chambers based on a measurement from the at least one temperature sensor.

In some embodiments, the at least one temperature sensor may be communicatively coupled with the at least one mass flow controller. The at least one mass flow controller may control a flow of dilution gas to at least one of the gas exhaust lines based on a measurement from the at least one temperature sensor. The at least one mass flow controller may increase a flow of dilution gas to the at least one of the gas exhaust lines when a temperature measured by the at least one temperature sensor exceeds a predetermined threshold. The at least one mass flow controller may increase a flow of dilution gas to the at least one of the gas exhaust lines when a temperature measured by the at least one temperature sensor exceeds a first threshold. The controller may cut off a flow of gas to the at least one of the one or more processing chambers when a temperature measured by the at least one temperature sensor exceeds a second threshold that is greater than the first threshold. The controller may cut off a flow of gas to the at least one of the one or more processing chambers when a temperature measured by the at least one temperature sensor exceeds a predetermined threshold. Each temperature sensor may be coupled with an exterior surface of a respective one of the gas exhaust lines. The systems may include a plurality of heater jackets. Each heater jacket may cover a respective one of the temperature sensors. The at least one gas source may independently control the flow of the gas to each of the one or more processing chambers. The at least one mass flow controller may independently control a flow of a diluent gas to each of the gas exhaust line.

Some embodiments of the present invention may encompass methods of abating gas from a processing chamber. The methods may include flowing a process gas to a processing chamber. The methods may include exhausting the process gas from the processing chamber via an exhaust assembly. The exhaust assembly may include a foreline and a pump fluidly coupled with the foreline. The methods may include flowing a dilution gas into a gas exhaust line downstream of the pump. The dilution gas may mix with the process gas within the gas exhaust line. The methods may include measuring a temperature of the gas exhaust line. The methods may include reducing a flow rate of the process gas to the processing chamber when the temperature exceeds a predetermined threshold.

In some embodiments, the methods may include adjusting a flow rate of the dilution gas when the temperature exceeds a preset threshold that is lower than the predetermined threshold. The methods may include flowing the dilution gas and the process gas into an abatement system. The methods may include adjusting a flow of one or more abatement gases based on a chemical recipe being used within the processing chamber. Reducing the flow rate of the process gas may include completely cutting off a supply of the process gas to the processing chamber.

Some embodiments of the present technology may encompass methods of abating gas from at least one processing chamber. The methods may include flowing at least one process gas to a plurality of processing chambers. The methods may include exhausting the process gas from each of the plurality of processing chambers via an exhaust assembly of each respective processing chamber. Each exhaust assembly may include a foreline, a pump fluidly coupled with the foreline, and a gas exhaust line extending between the pump and an abatement system. The methods may include flowing a dilution gas into each gas exhaust line downstream of each respective pump. The dilution gas may mix with the process gas within the gas exhaust line. The methods may include measuring a temperature of each gas exhaust line. The methods may include adjusting a flow rate of one or more gases when the temperature within a corresponding gas exhaust line exceeds a predetermined threshold.

In some embodiments, the at least one process gas flowed to one of the plurality of processing chambers may be different than the at least one process gas flowed to another of the plurality of processing chambers. Adjusting the flow rate of the one or more gases may include cutting off a supply of the at least one process gas to the respective one of the plurality of processing chambers while enabling the at least one process gas to flow to continue to flow to at least one other processing chamber of the plurality of processing chambers. Adjusting the flow rate of the one or more gases may include adjusting a flow rate of the dilution gas to a particular one of the gas exhaust lines when the temperature of the particular one of the gas exhaust lines exceeds a preset threshold that is lower than the predetermined threshold. Each gas exhaust line may be coupled with a different inlet of the abatement system. The methods may include adjusting a flow of one or more abatement gases at an inlet of the abatement system based on a chemical recipe being used within a particular processing chamber associated with a respective one of the gas exhaust lines coupled with the inlet of the abatement system.

Such technology may provide numerous benefits over conventional systems and techniques. For example, embodiments of the present technology may reduce the volume of dilution and/or abatement gases used in the disposal of toxic process gases. For example, embodiments may enable a flow rate of dilution gases and/or abatement gases to be tuned to exactly or closely match the needs of a particular chemical recipe. Additionally, in embodiments where the exhaust and/or abatement equipment is shared across multiple chambers embodiments may enable the flow of process gases, dilution gases, and/or abatement gases for each chamber to be independently controlled. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
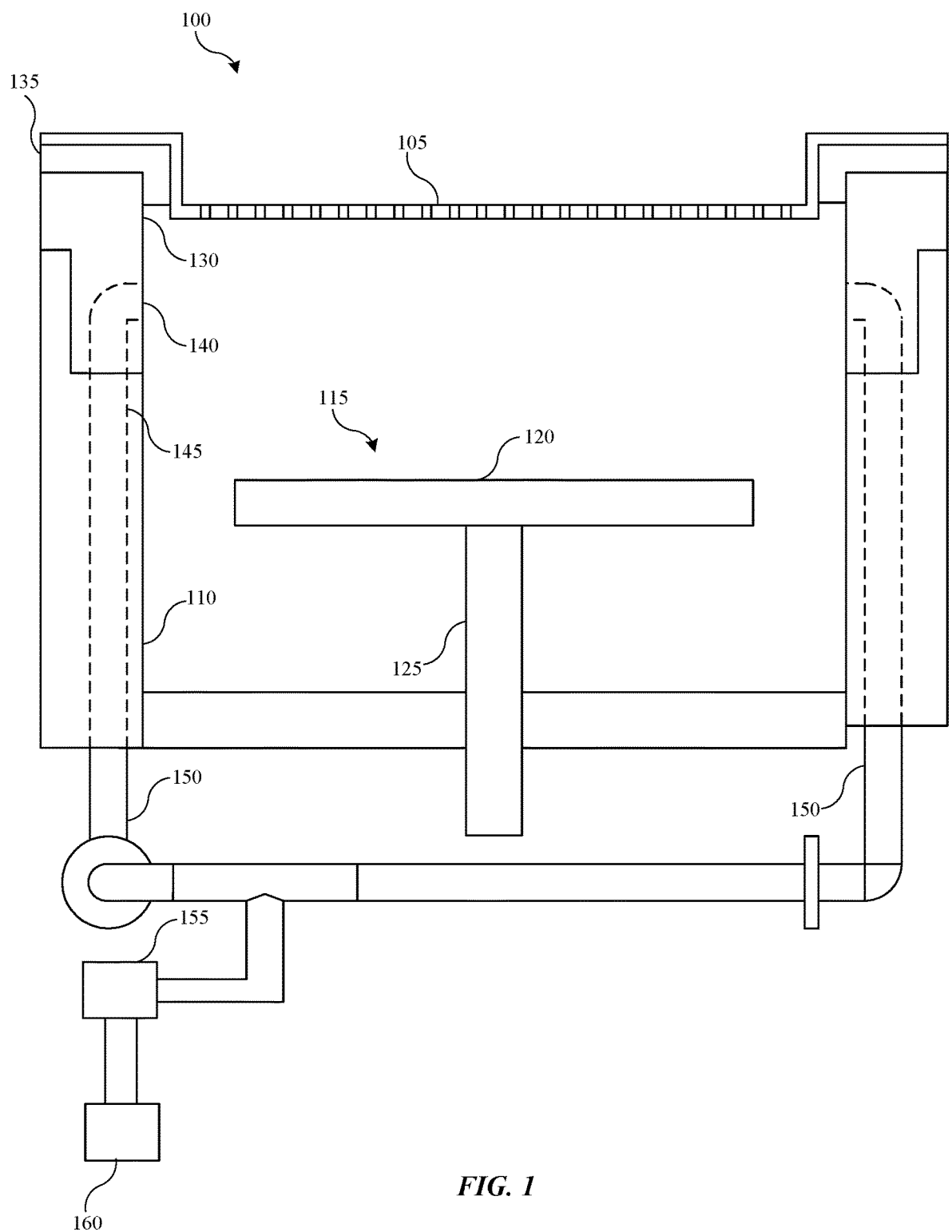
FIG. 1 shows a top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION OF THE INVENTION

Semiconductor processing operations often involve the use of plasma-generating precursors and/or other process gases to form deposition, etching, and/or other processing operations. Some processing operations may involve the use of toxic and/or flammable gases that, upon being exhausted from a processing chamber, must be disposed. Oftentimes, the disposal of the exhausted gases may involve delivering the exhausted gases to an abatement system that subsequently burns the exhausted gases. While these gases are generally stable during the processing operations, problems may arise during the venting process, as the pressure within the exhaust assembly rises relative to the vacuum maintained within the processing chamber. The increasing pressure within the exhaust assembly may lead to exothermic reactions of flammable gases within the exhaust line.

To prevent the occurrence of these exothermic reactions, conventional exhaust/abatement systems introduce a dilution gas into the exhaust line to dilute the exhausted process gases. However, conventional systems do not include any feedback loops to determine when and/or how much dilution gas should be used to dilute the exhausted process gases. Therefore, current systems typically set a flow rate of the dilution gas to a rate that is sufficiently high to dilute a highest volume of process gas exhausted by the chamber for any chemical recipe that may be utilized within the chamber. Additionally, conventional systems typically overdilute by 20%-50% to provide an additional factor of safety to ensure that no exothermic reactions occur. Such operation, while effective in preventing exothermic reactions upstream of the abatement system, contributes to a substantial amount of waste due to the high volumes of dilution gas (often well above a volume that is necessary for a particular processing operation). Additionally, conventional abatement systems flow a constant amount of abatement gases regardless of the chemical recipe being flowed within the processing chamber. This too contributes to unnecessary waste of gases.

The present technology overcomes these challenges by including one or more temperature sensors that enable the rise in temperature that occurs during exothermic reactions to be detected. For example, the temperature sensors may be positioned downstream of a pump of the exhaust assembly, as the area downstream of the pump is typically where the pressure in the exhaust assembly is high enough to lead to the exothermic reactions. Based on the temperature within the exhaust assembly, a flow rate of dilution gas may be adjusted to help prevent concentrations of the exhausted gas from rising to levels that are likely to react. If the temperature within the exhaust assembly exceeds a threshold level, the delivery of process gases to the chamber may be reduced and/or entirely shut off to prevent any further concentration of the flammable gases within the exhaust assembly to alleviate and or prevent the occurrence of any exothermic reactions. In embodiments in which a single exhaust assembly and/or abatement system is shared across multiple chambers, the adjustment of flow of the dilution gas and/or process gas may be performed independently for each chamber, which may enable different chemical recipes to be flowed in each chamber and/or may enable flow to continue to one chamber while being shut off at another chamber. Additionally, embodiments may enable a flow of abatement gases to be customized for a given chemical recipe being delivered to a particular chamber. Accordingly, the present technology may decrease the amount of dilution and/or abatement gases used and wasted during processing and/or cleaning operations.

Although the remaining disclosure will routinely identify specific venting processes utilizing the disclosed technology, it will be readily understood that the systems and methods are equally applicable to other deposition and cleaning chambers, as well as processes as may occur in the described chambers. Accordingly, the technology should not be considered to be so limited as for use with these specific deposition processes or chambers alone. The disclosure will discuss one possible system and chamber that may include lid stack components according to embodiments of the present technology before additional variations and adjustments to this system according to embodiments of the present technology are described.

FIG. 1 shows a schematic partial cross-sectional view of an exemplary processing chamber 100 according to some embodiments of the present technology. The chamber 100 may be used to perform semiconductor processing operations including deposition of hardmask materials as previously described, as well as other deposition, removal, and cleaning operations. Chamber 100 may show a partial view of the chamber components being discussed and that may be incorporated in a semiconductor processing system, and may illustrate a view across a center of the faceplate, which may otherwise be of any size, and include any number of apertures. Any aspect of chamber 100 may also be incorporated with other processing chambers or systems as will be readily understood by the skilled artisan.

Chamber 100 may include a processing chamber including a faceplate 105, through which precursors may be delivered for processing, and which may be coupled with a power source for generating a plasma within the processing region of the chamber. For example, precursors, cleaning gases, and/or other gases may be delivered to the faceplate 105 from one or more gas sources (such as a gas panel) via one or more gas delivery components (e.g., a gasbox, a blocker plate, etc.). The chamber may also include a chamber body 110, which as illustrated may include sidewalls and a base. A pedestal or substrate support 115 may extend through the base of the chamber as previously discussed. The substrate support 115 may include a support plate 120, which may support semiconductor substrate. The support plate 120 may be coupled with a shaft 125, which may extend through the base of the chamber.

The faceplate 105 may be supported, either directly or indirectly, by the chamber body 110. As just one example, the faceplate 105 may be supported atop a pumping liner 130 and/or a isolator or other liner 135. For example, the pumping liner 130 may be seated on a shelf formed by a top of the chamber body 110, with the additional liner 135 and/or faceplate 105 seated atop the pumping liner 130. Pumping liner 130 may define one or more exhaust ports 140 that enable the flow of gases from the processing region to one or more forelines 150 that are coupled with the processing chamber. For example, each exhaust port 140 may be fluidly coupled with a top end of one or more exhaust lumens 145 that are formed within the sidewalls and/or base of the chamber body 110. A bottom end of exhaust lumen 145 may be coupled with a respective one of the forelines 150. Each foreline 150 may define a fluid conduit for flowing process gases out of the processing chamber and directing the process gases through a throttle valve 155, which may control the fluid conductance through the forelines 150. A pump 160 may be coupled with a downstream end of the throttle valve 155 and/or forelines 150 for pumping the gases out of the chamber body 110.

While illustrated as a side-pumping chamber having a pumping liner 130, it will be appreciated that other configurations are possible. For example, the chamber 100 may be a bottom-pumping chamber in which gases are vented from the chamber via one or more exhaust apertures formed in or proximate a bottom of the chamber body 110. The exhaust apertures may be coupled with the forelines 150, throttle valve 155, and/or pump 160. Other configurations of exhaust components may exist in various embodiments.

Figure 2:
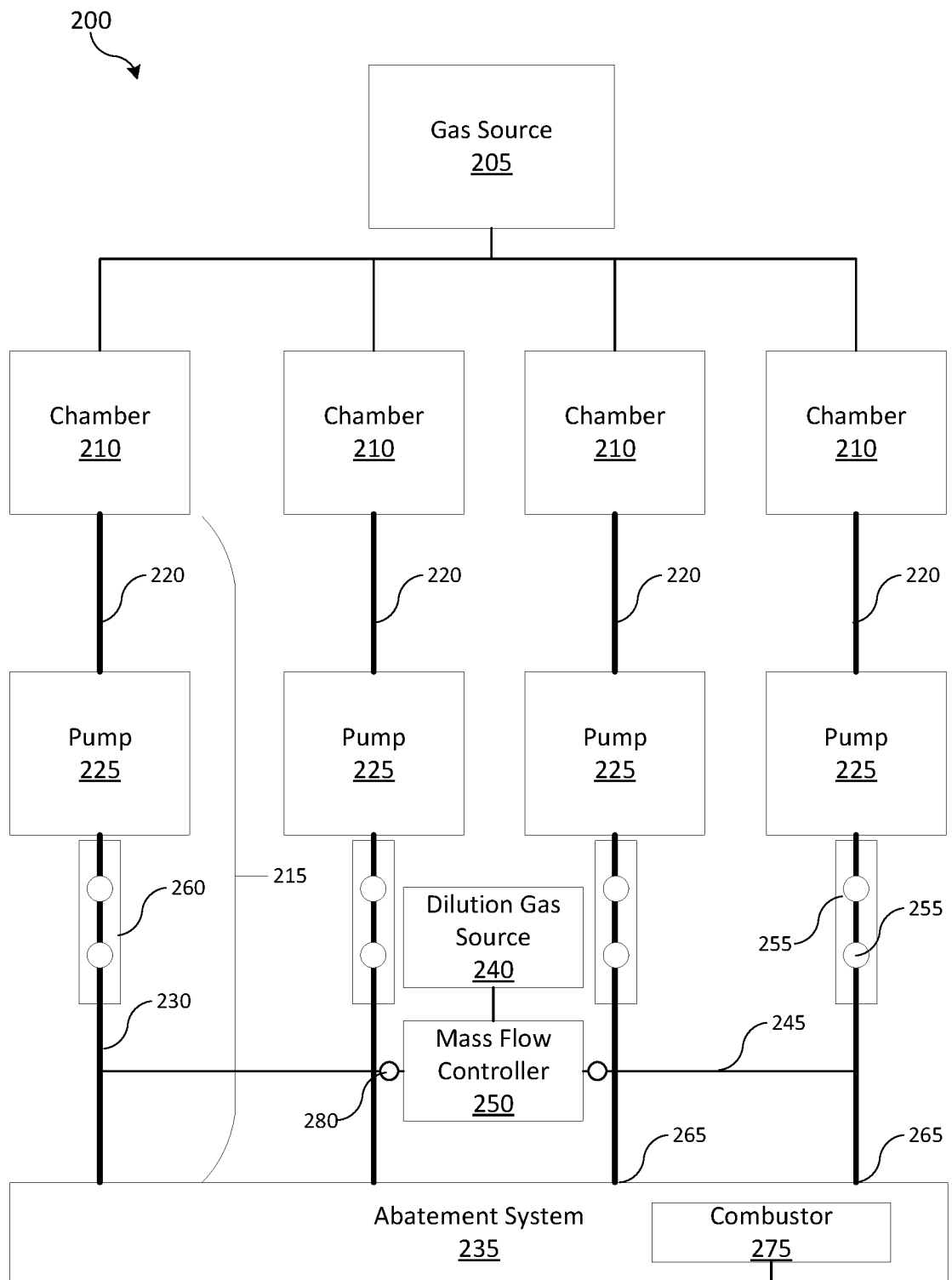
FIG. 2 shows a schematic top plan view of an exemplary processing system according to some embodiments of the present technology.

FIG. 2 shows a schematic diagram of an exemplary substrate processing system 200 of deposition, etching, baking, and curing chambers according to some embodiments of the present technology. System 200 may include one or more gas sources 205 that each deliver one or more gases to one or more processing chambers 210. For example, each gas source 205 may be a gas panel that delivers one or more process gases, (such as plasma-generating precursors, inert gases, cleaning gases, and/or other gases) to some or all of the chambers 210. As illustrated, system 200 includes four chambers 210, however any number of chambers 210 may be present in various embodiments. For example, system 200 may include one or more chambers, two or more chambers, three or more chambers, four or more chambers, five or more chambers, six or more chambers, seven or more chambers, eight or more chambers, or more. Here, each of the chambers 210 shares a single gas source 205 (e.g., gas panel), with one or more controllers that operate a number of valves, mass flow controllers, and/or other flow control devices being used to control the flow of any gases for a particular chemical recipe to the various chambers 210. The controller of the gas source 205 may control the flow of gas to each chamber 210 independently such that the chemical recipe delivered to each chamber 210 may be the same or different.

Each chamber 210 may be similar to chamber 100 described above, and may include any feature described in relation to chamber 100. For example, each chamber 210 may define a processing region in which one or more processing operations, such as deposition processes including cyclical layer deposition, atomic layer deposition, chemical vapor deposition, physical vapor deposition, as well as etch, pre-clean, anneal, plasma processing, degas, orientation, and other substrate processes may be performed. Each chamber 210 may include a substrate support that may receive a semiconductor (or other substrate) during processing operations. Gases from the gas source 205 may be delivered to the processing region via a gas delivery assembly, which may include, without limitation, a gasbox, a blocker plate, and/or a faceplate. Gases flowed into a chamber 210 may be exhausted out of the chamber 210 via an exhaust assembly 215, which may include, without limitation, a pumping liner, a foreline 220, a throttle valve, a pump 225, and/or a gas exhaust line 230. As illustrated, the exhaust assembly 215 includes a foreline 220 that is fluidly coupled with the chamber 210 (such as via a pumping liner), and a pump 225 is fluidly coupled with a downstream end of the foreline 220. A downstream end of the pump 225 may be fluidly coupled with an abatement system 235, with the gas exhaust line 230 extending between and fluidly coupling the pump 225 and the abatement system 235.

In some embodiments, each chamber 210 may be coupled with a dedicated abatement system 235. However, in many embodiments, multiple (and possibly all) of the chambers 210 may share a single abatement system 235. In such embodiments, the exhaust assembly 215 of each chamber 210 may be coupled with a separate inlet of the abatement system 235. This may enable the flow of abatement gases to the abatement system 235 to be customized based on the chemical recipe being flowed into and exhausted from each chamber 210.

Prior to reaching the abatement system 235, the exhausted process and/or cleaning gases from the chamber 210 may be diluted to help prevent the exhausted gases from reacting.

For example, a dilution gas source 240 may be coupled with the exhaust assembly 215 downstream of the pump 225. In some embodiments, this may entail providing a dilution line 245 that extends between the dilution gas source 240 and a respective gas exhaust line 230. To control the flow rate of the dilution gas, a mass flow controller 250 and/or other flow control device may be coupled between the dilution gas source 240 and the gas exhaust line 230. In some embodiments, each gas exhaust line 230 may have a dedicated dilution gas source 240 and/or mass flow controller 250, while in other embodiments multiple gas exhaust lines 230 may share a single dilution gas source 240 and/or mass flow controller 250.

One or more temperature sensors 255 may be coupled with each gas exhaust line 230 such that a temperature downstream of the pump 225 (e.g., between the pump 225 and the abatement system 235) may be monitored. The temperature sensors 255 may be coupled with an exterior surface of the gas exhaust line 230, positioned within an interior lumen of the gas exhaust line 230, and/or otherwise coupled with the gas exhaust line 230 to enable the temperature of the gas exhaust line 230 and/or gases passing therethrough may be monitored. In some embodiments, one or more heater jackets 260 may be positioned about an exterior surface of the gas exhaust line 230 and/or the temperature sensors 255. While shown with a single temperature sensor 255, it will be appreciated that any number of temperature sensors may be coupled with a respective gas exhaust line 230. For example, each gas exhaust line 230 may include one or more temperature sensors, two or more temperature sensors, three or more temperature sensors, four or more temperature sensors, or more.

The temperature sensors 255 may be communicatively coupled with the gas source 205, dilution gas source 240, and/or mass flow controller 250, which may enable temperature measurements from the temperature sensors 255 to be used to provide feedback for controlling the flow of process/cleaning gases to a particular chamber 210 and/or to control a flow of dilution gas to a particular gas exhaust line 230. For example, the controller of the gas source 205 may control and/or otherwise adjust a flow of one or more process and/or cleaning gases to one or more processing chambers 210 based on a measurement from a temperature sensor 255. In a particular embodiment, the controller of the gas source 205 may reduce a flow rate and/or entirely cut off a supply (e.g., a flow rate of 0 lpm) of one or more process and/or cleaning gases to a processing chamber 210 when the temperature of the gas exhaust line 230 associated with that processing chamber 210 exceeds a predetermined threshold. The threshold may be set below a reaction temperature of the gases being exhausted from the chamber 210 and/or at a temperature that is indicative of the start of a small amount of exothermic reactions within the gas exhaust line 230. In some embodiments, the threshold may be at least or about 5° C., at least or about 10° C., at least or about 15° C., at least or about 20° C., at least or about 25° C., at least or about 50° C., or more degrees less than the reaction temperature. In a particular embodiment, the threshold may be less than or about 210° C., less than or about 205° C., less than or about 200° C., less than or about 195° C., less than or about 190° C., less than or about 185° C., less than or about 180° C., less than or about 175° C., or less, depending on the gases being flowed through the chamber 210 and exhaust assembly 215. In some embodiments, multiple thresholds may be used, with lower threshold temperatures resulting in the flow of gases being throttled down or otherwise reduced, while a final (i.e., highest) threshold similar to that described above may result in the flow of gases being entirely shut off using one or more valves of the gas source 205. In some embodiments, if no dilution gas is being flowed to a particular gas exhaust line 230, the valves of the gas source 205 may be shut to ensure that no toxic and/or flammable gases may be flowed into and exhausted from the chambers 210 without sufficient dilution gas present. In some embodiments, the detection of dilution gas flow may be made based on a signal from the mass flow controller 250, a temperature measurement from the temperature sensor 255 (such as a temperature of or within the gas exhaust line 230 being below a known temperature of the dilution gas), and/or using one or more flow sensors and/or flow sensor switches 280 interfaced with the gas exhaust line 230 and/or dilution line 245. The flow sensors and/or flow sensor switches 280 may measure a flow rate of the dilution gas and ensure that the flow rate meets a minimum threshold flow rate in order to flow the process/cleaning gases. If the flow rate is below this threshold, the flow sensors and/or flow sensor switches 280 may cause the flow of the process/cleaning gases to be halted. This may ensure that a minimum flow rate/volume of dilution gas is flowing into the gas exhaust lines 230 to dilute the exhausted gases.

In some embodiments, each mass flow controller 250 may control a flow of dilution gas to at least one of the gas exhaust lines 230 based on a measurement from the temperature sensor 255 associated with that gas exhaust line 230. For example, a preset flow rate of dilution gas may be flowed for a given chemistry as long as a temperature measurement stays below a particular preset threshold (which may be less than the predetermined threshold used by the controller of the gas source 205), with the mass flow controller 250 increasing the flow rate of the dilution gas when the temperature exceeds the preset threshold. The flow rate of the dilution gas may be increased proportionally with the temperature and/or may be increased in a step-wise manner. In some embodiments, multiple temperature thresholds may be utilized, such that each time a higher temperature threshold is surpassed, the flow rate of the dilution gas is increased by a particular amount and/or to a particular level. The flow of dilution gas may be controlled independently for each chamber/gas exhaust line 230 in some embodiments. In some embodiments, the amount of dilution gas flowed to each gas exhaust line 230 may be set based on the recipe being flowed through a particular chamber 210. For example, empirical data may be used to generate tables, formulas, etc. that may be used to determine how much of a given dilution gas needs to be flowed for each step of a given recipe to adequately dilute the exhausted gas. In the event that more dilution is needed for a given step, the temperature sensor 255 may detect a rise in temperature that triggers the mass flow controller 250 to increase the amount of dilution gas flowed to a particular one of the gas exhaust lines 230. Thus, some embodiments may enable the control of the dilution gas based on the recipe to be further supplemented by providing a dynamic tuning knob based on the temperature within the gas exhaust lines 230. For example, the initial flow rates of the dilution gases may be set based on the recipe, with the flow rates being adjusted if the temperature within the gas exhaust lines 230 exceeds the predetermined threshold.

By using the temperature of the gas exhaust line 230 for each processing chamber as a feedback loop variable to control the flow rate of process/cleaning gases and/or dilution gases, embodiments may enable the flow of gases to be customized based on the conditions within the exhaust assembly to prevent the occurrence of exothermic reactions of flammable gases while reducing the use of dilution gases. For example, when the measured temperature of the gas exhaust line 230 and/or gases flowing therein exceed the predetermined threshold, the gas source 205 may reduce and/or cut off supply of the process/cleaning gases to the chamber 210, which subsequently reduces the volume of gases being exhausted from the chamber 210. This, in turn, may reduce the concentration of the exhausted gases within the gas exhaust line 230 associated with that chamber 210 and may decrease the likelihood of undesired exothermic reactions within the gas exhaust line 230. By enabling the gas supply for each chamber 210 to be controlled independently of one another, the flow of gases to a subset (e.g., one or more) of the chambers 210 may be reduced or halted while enabling the flow of gases to another subset of the chambers 210 to be unimpacted. Additionally, by tuning the flow rate of dilution gases based on the temperature of the gas exhaust line 230 and/or gases flowing therein, the use and waste of dilution gas may be reduced, while still enabling the flow rate to be increased when temperatures increase to prevent the occurrence of exothermic reactions within the gas exhaust line 230. This enables a flow of the dilution gas to be tailored to the specific needs of the application via a feedback loop to ensure that the processing system operates safely while reducing dilution gas usage.

The abatement system 235 may include a number of inlets 265, with each inlet being coupled with the gas exhaust line 230 of one of the chambers 210. The abatement system 235 may be coupled with and/or include one or more abatement gas sources 270, which may deliver one or more abatement gases to the abatement system 235. For example, the abatement gases may include methane, O2, hydrogen, and/or other fuels that may be used to power a burner or combustor 275 that heats the exhausted (and dilution) gases to temperatures that are sufficiently high to burn the exhausted gases and/or cause reactions that convert the exhausted gases to safe and/or otherwise stable byproducts.

The abatement system 235 may be communicatively coupled with the controller of the gas source 205, which may enable the flow of abatement gases (e.g., fuel sources) to be controlled (e.g., set and/or adjusted) based on the chemical recipe being flowed to each chamber 210 that is connected with the abatement system 235. For example, based on the volume, flow rate, timing, and/or other characteristics of a particular recipe, the flow rate and/or type of abatement gases flowed to the combustor 275 may be adjusted to most efficiently heat the exhausted gases present within the combustor 275, while minimizing and/or otherwise reducing the amount of fuel needed. For example, lookup tables may be generated that indicate how much of a given abatement gas is needed to fuel the combustor 275 for each step in a given recipe. Each step in the recipe may be associated with a given set of one or more gases and a timing element (e.g., start time, end time, duration, etc.). A volume and/or flow rate of one or more abatement gases needed for each step is provided. The abatement system 235 and/or abatement gas source 270 may communicate with the controller of the gas source 205 and/or other device to determine what recipe is being flowed to each connected chamber 210 and use the table to identify a flow rate, timing, volume, selection, and/or other settings for one or more abatement gases are needed to safely and completely abate the exhausted gases. Where multiple chambers 210 are in operation, the abatement system 235 and/or abatement gas source 270 may factor in the recipes and timing for each chamber 210 that exhausts gases to the combustor 275 to ensure that sufficient abatement gases are present at any given point in time. This may enable different chambers 210 to utilize different recipes and/or operate out of synch with one another, as the abatement system 235 and/or abatement gas source 270 may determine a total flow and concentration of gases present at each inlet 265 and/or the combustor 275 based on the recipe used in each chamber 210.

Figure 3:
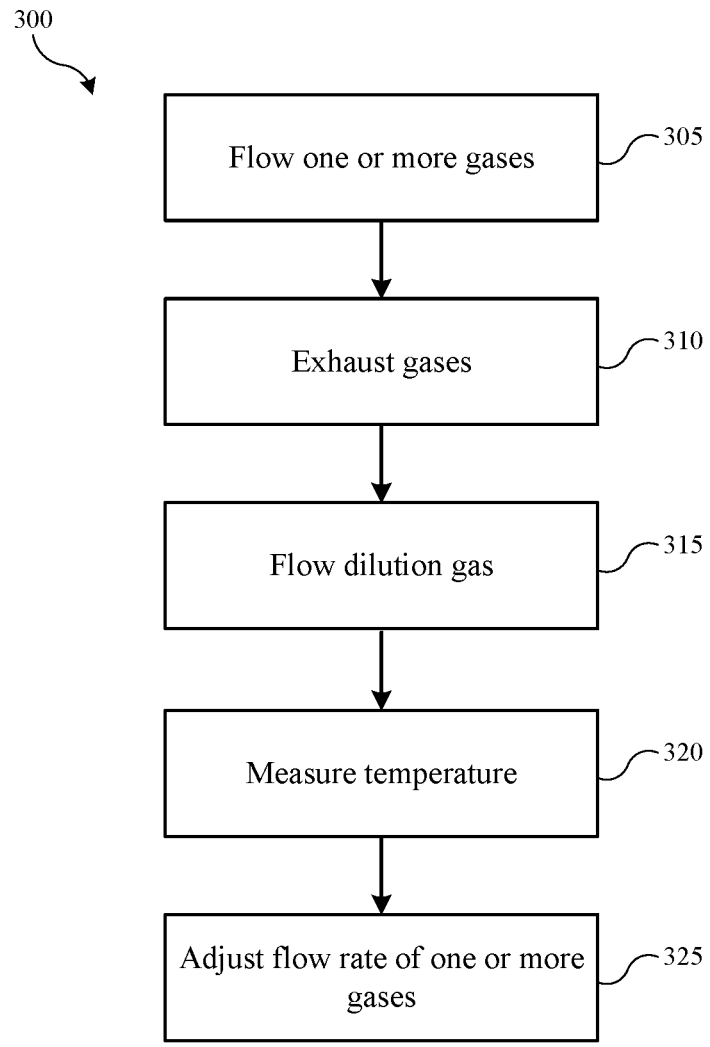
FIG. 3 shows operations of an exemplary method of flowing a gas to one or more processing chambers according to some embodiments of the present technology.

FIG. 3 shows operations of an exemplary method 300 of abating gas from one or more processing chambers according to some embodiments of the present technology. The method may be performed in a variety of processing systems, including processing chamber 100 or system 200 described above, which may include gas sources, exhaust assemblies, or abatement systems according to embodiments of the present technology, such as any gas source, exhaust assembly, or abatement system discussed previously. Method 300 may include a number of optional operations, which may or may not be specifically associated with some embodiments of methods according to the present technology.

Method 300 may include a processing method and/or cleaning method that may involve flowing one or more gases into one or more processing chambers at operation 305. For example, the method 300 may include operations for forming a hardmask film or other deposition operations. The method may include optional operations prior to initiation of method 300, or the method may include additional operations. For example, method 300 may include operations performed in different orders than illustrated. Method 300 may include flowing at least one process and/or cleaning gas to one or more processing chambers. The gas and/or gas mixture supplied to each chamber may be the same or different in various embodiments. The gases flowed may include plasma generating precursors, inert gases, cleaning gases, and/or other gases. In some embodiments, one or more of the gases may be flammable and/or toxic and may need to be carefully disposed, such as by using thermal abatement.

During and/or after the processing and/or cleaning operations, the gases may be exhausted from each chamber via a corresponding exhaust assembly, such as the exhaust assembly 215 at operation 310. For example, the gases may be pumped through a foreline and pump and into a gas exhaust line that extends between the pump and an abatement system. At operation 315, a dilution gas may be flowed into each gas exhaust line downstream of the pump, with the dilution gas mixing with the process and/or cleaning gas being exhausted from the chamber. The flow of dilution gas may be used to dilute the process and/or cleaning gas to prevent concentrations of the exhausted gas from reaching levels that will generate exothermic reactions when pressures and/or temperatures within the gas exhaust line increase.

At operation 320, a temperature of each gas exhaust line and/or the gas flowing therethrough may be measured using one or more temperature sensors that are coupled with each gas exhaust line. Based on the measured temperature, one or more actions may be performed. For example, at operation 325, a flow rate of one or more gases may be adjusted when the measured temperature exceeds a predetermined threshold. As just one example, if the temperature of a particular gas exhaust line and/or the gas flowing therethrough exceeds the predetermined threshold, a controller of the gas source may reduce the flow rate and/or completely cut off the supply of the process and/or cleaning gas to the chamber associated with the gas exhaust line in which the high temperature was detected. This may lower the concentration of the process and/or cleaning gases in the gas exhaust line to prevent and/or alleviate any exothermic reactions occurring within the gas exhaust line. The flow of process and/or cleaning gas for each chamber may be controlled independently of one another such that when the flow rate of gases to one chamber is reduced or shut off, the flow of gases to the other chambers remains unaffected.

In some embodiments, adjusting the flow rate of one or more gases may include adjusting a flow rate of the dilution gas to a particular one of the gas exhaust lines when the temperature associated with the gas exhaust line exceeds a preset threshold (which may be lower than the predetermined threshold associated with the adjustments of the process/cleaning gases). The flow rate of the dilution gas when the temperature may be increased when the temperature exceeds the preset threshold. The flow rate of the dilution gas may be increased proportionally with the temperature and/or may be increased in a step-wise manner. In some embodiments, multiple temperature thresholds may be utilized, such that each time a higher temperature threshold is surpassed, the flow rate of the dilution gas is increased by a particular amount and/or to a particular level. The flow of dilution gas may be controlled independently for each chamber/gas exhaust line in some embodiments.

The dilution gas and the process/cleaning gases may be flowed to an abatement system for thermal disposal. For example, the gases flowing through each gas exhaust line may be flowed into a separate inlet of one or more abatement systems. In some embodiments, a processor of the abatement system and/or a processor of one or more abatement gas sources (or mass flow controllers coupled therewith) may be communicatively coupled with the gas source supplying gases to each chamber coupled with the abatement system. This may enable the flow rate, type, timing, and/or other characteristics of abatement gases to be adjusted based on the chemistries that are being flowed to and exhausted from each chamber that is coupled with the abatement system. For example, based on the recipes being flowed into the abatement system at a given time, the abatement gases may be adjusted to efficiently thermally abate the exhausted gases. For example, based on the volume, flow rate, timing, and/or other characteristics of a particular recipe, the flow rate and/or type of abatement gases flowed to a combustor of the abatement system may be adjusted to most efficiently heat the exhausted gases present within the combustor, while minimizing and/or otherwise reducing the amount of fuel needed. For example, lookup tables may be generated that indicate how much of a given abatement gas is needed to fuel the combustor for each step in a given recipe. Each step in the recipe may be associated with a given set of one or more gases and a timing element (e.g., start time, end time, duration, etc.). A volume and/or flow rate of one or more abatement gases needed for each step is provided. The abatement system and/or abatement gas source may communicate with the controller of the gas source and/or other device to determine what recipe is being flowed to each connected chamber and use the table to identify a flow rate, timing, volume, selection, and/or other settings for one or more abatement gases are needed to safely and completely abate the exhausted gases. Where multiple chambers are in operation, the abatement system and/or abatement gas source may factor in the recipes and timing for each chamber that exhausts gases to the combustor to ensure that sufficient abatement gases are present at any given point in time. This may enable different chambers to utilize different recipes and/or operate out of synch with one another, as the abatement system and/or abatement gas source may determine a total flow and concentration of gases present at each inlet and/or the combustor based on the recipe used in each chamber.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a region" includes a plurality of such regions, and reference to "the aperture" includes reference to one or more apertures and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. A method of abating gas from a processing chamber, comprising:
    flowing a process gas to a processing chamber;
    exhausting the process gas from the processing chamber via an exhaust assembly comprising:
        a foreline; and
        a pump fluidly coupled with the foreline;
    flowing a dilution gas into a gas exhaust line downstream of the pump, wherein the dilution gas mixes with the process gas within the gas exhaust line;
    measuring a temperature of the gas exhaust line;
    reducing a flow rate of the process gas to the processing chamber when the temperature exceeds a predetermined threshold; and
    adjusting a flow rate of the dilution gas when the temperature exceeds a preset threshold that is lower than the predetermined threshold.

2. The method of abating gas from a processing chamber of claim 1, further comprising:

flowing the dilution gas and the process gas into an abatement system.

3. The method of abating gas from a processing chamber of claim 2, further comprising:
adjusting a flow of one or more abatement gases based on a chemical recipe being used within the processing chamber.

4. The method of abating gas from a processing chamber of claim 1, wherein:
reducing the flow rate of the process gas comprises completely cutting off a supply of the process gas to the processing chamber.

5. A method of abating gas from at least one processing chamber, comprising:
flowing at least one process gas to a plurality of processing chambers;
exhausting the process gas from each of the plurality of processing chambers via an exhaust assembly of each respective processing chamber, each exhaust assembly comprising:
a foreline;
a pump fluidly coupled with the foreline; and
a gas exhaust line extending between the pump and an abatement system;
flowing a dilution gas into each gas exhaust line downstream of each respective pump, wherein the dilution gas mixes with the process gas within the gas exhaust line;
measuring a temperature of each gas exhaust line; and
adjusting a flow rate of one or more gases when the temperature within a corresponding gas exhaust line exceeds a predetermined threshold; and
adjusting the flow rate of the one or more gases comprises adjusting a flow rate of the dilution gas to a particular one of the gas exhaust lines when the temperature of the particular one of the gas exhaust lines exceeds a preset threshold that is lower than the predetermined threshold.

6. The method of abating gas from at least processing chamber of claim 5, wherein:
the at least one process gas flowed to one of the plurality of processing chambers is different than the at least one process gas flowed to another of the plurality of processing chambers.

7. The method of abating gas from at least processing chamber of claim 5, wherein:
adjusting the flow rate of the one or more gases comprises cutting off a supply of the at least one process gas to the respective one of the plurality of processing chambers while enabling the at least one process gas to flow to continue to flow to at least one other processing chamber of the plurality of processing chambers.

8. The method of abating gas from at least processing chamber of claim 5, wherein:
each gas exhaust line is coupled with a different inlet of the abatement system.

9. The method of abating gas from at least processing chamber of claim 5, further comprising:
adjusting a flow of one or more abatement gases at an inlet of the abatement system based on a chemical recipe being used within a particular processing chamber associated with a respective one of the gas exhaust lines coupled with the inlet of the abatement system.

* * * * *